United States Patent [19]
Furuhata

[11] Patent Number: 5,767,450
[45] Date of Patent: Jun. 16, 1998

[54] COATED CONDUCTOR AND PRODUCTION METHOD OF SAME AND ELECTRONIC COMPONENTS AND ELECTRONIC DEVICES THAT USE IT

[75] Inventor: Katsutoshi Furuhata, Suwa, Japan

[73] Assignee: Seiko Epson Corporation, Tokyo, Japan

[21] Appl. No.: 584,877

[22] Filed: Jan. 11, 1996

[30] Foreign Application Priority Data

Jan. 13, 1995 [JP] Japan .................. 7-004479

[51] Int. Cl.⁶ .................................................. H01B 7/00
[52] U.S. Cl. ............................................... 174/110 R
[58] Field of Search ........................... 174/24, 36, 110 R, 174/110 AR, 120 AR, 250, 255, 258, 107

[56] References Cited

U.S. PATENT DOCUMENTS

| | | | |
|---|---|---|---|
| 3,119,897 | 1/1964 | Coper | 174/110 R |
| 4,041,955 | 8/1977 | Kelly et al. | 128/419 |
| 4,152,540 | 5/1979 | Duncan et al. | 174/152 |
| 4,159,075 | 6/1979 | Ljung et al. | 228/116 |
| 4,168,219 | 9/1979 | Hiiro et al. | 204/195 M X |
| 4,340,773 | 7/1982 | Perreault | 174/107 |
| 4,525,766 | 6/1985 | Petersen | 361/283 |
| 4,551,488 | 11/1985 | Leech et al. | 523/427 X |
| 4,725,480 | 2/1988 | Gurol | 428/210 |
| 4,806,188 | 2/1989 | Rellick | 156/89 X |
| 4,861,641 | 8/1989 | Foster et al. | 428/137 |
| 4,882,298 | 11/1989 | Moeller et al. | 437/212 |
| 4,963,425 | 10/1990 | Buchanan et al. | 428/212 X |
| 5,002,768 | 3/1991 | Kondo et al. | 424/408 X |
| 5,193,539 | 3/1993 | Schulman et al. | 128/419 |
| 5,219,657 | 6/1993 | Ueoka et al. | 428/379 X |

*Primary Examiner*—Kristine L. Kincaid
*Assistant Examiner*—Chau N. Nguyen
*Attorney, Agent, or Firm*—Mark P. Watson

[57] ABSTRACT

A coated conductor, its production method, electronic components and electornic devices that are configured with the coated conductors are disclosed. In an electronic component of the invention, a copper wire, which is 5 to 50 μm in diameter, is wrapped in layers around a magnetic core of a coil with an insulation film between them. An insulation coating is formed around the copper wires to insulate the copper wires from each other. Japanese lacquer formed into a thin film is used as the insulation coating on the copper wires. Since Japanese lacquer is used, an extremely thin insulation coating can be formed, thus making it possible to wind more copper wire in the effective winding area of the coil. Furthermore, the production method is simplified and costs are reduced by using a thin-film insulation coating with good insulation performance and durability, (e.g., water resistance, alkaline resistance, acid resistance).

18 Claims, 3 Drawing Sheets

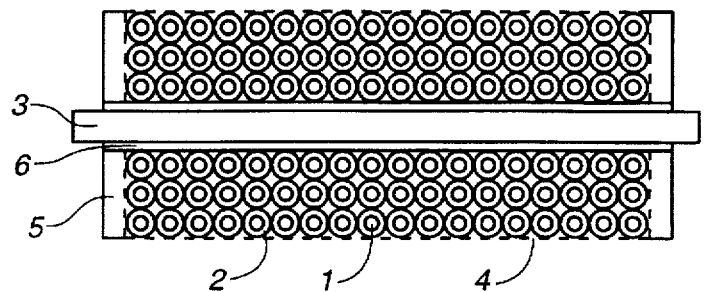
FIG._1
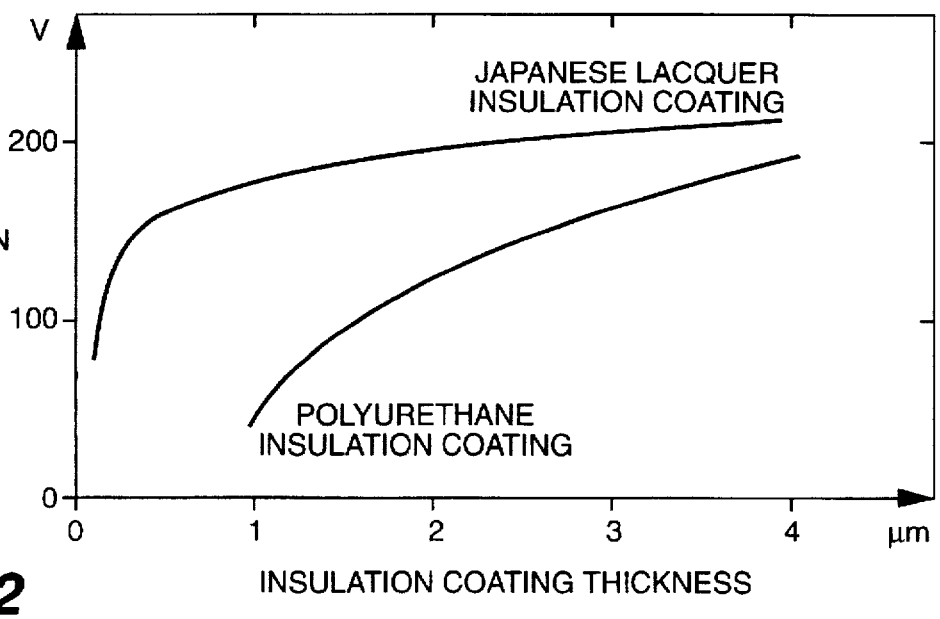
FIG._2
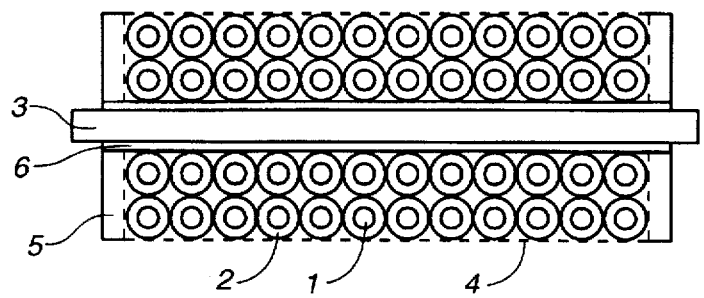
FIG._3

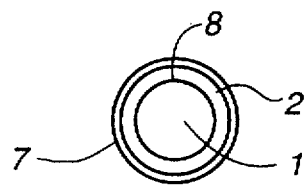
FIG._4
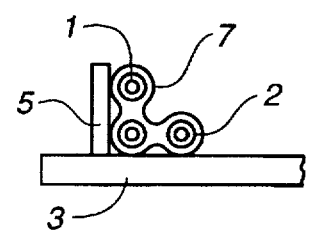
FIG._5
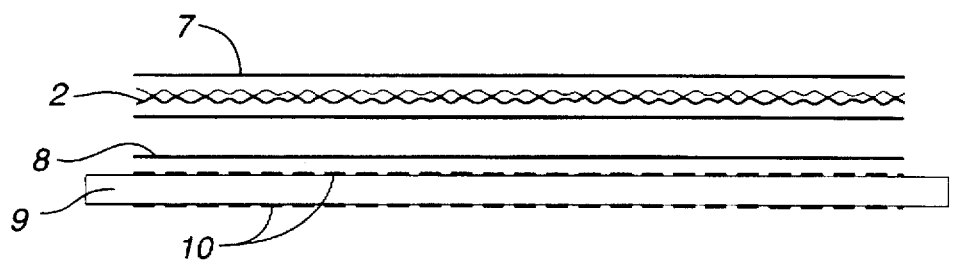
FIG._6
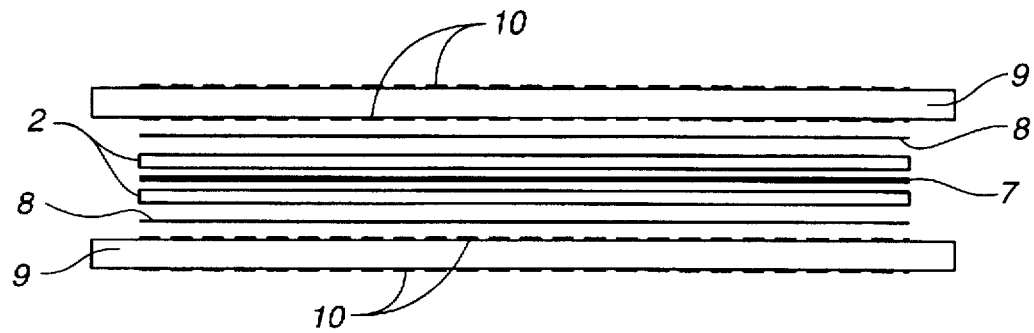
FIG._7
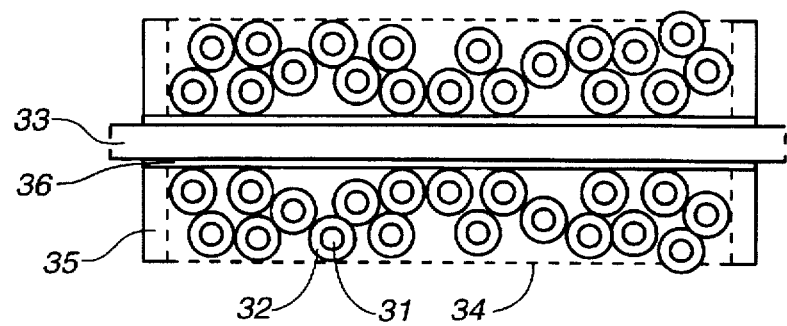
FIG._9
(PRIOR ART)

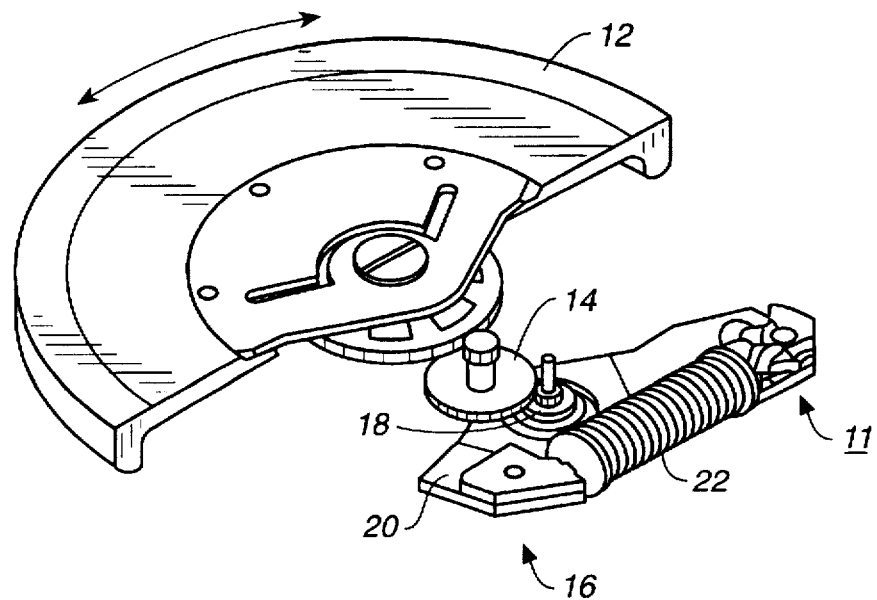
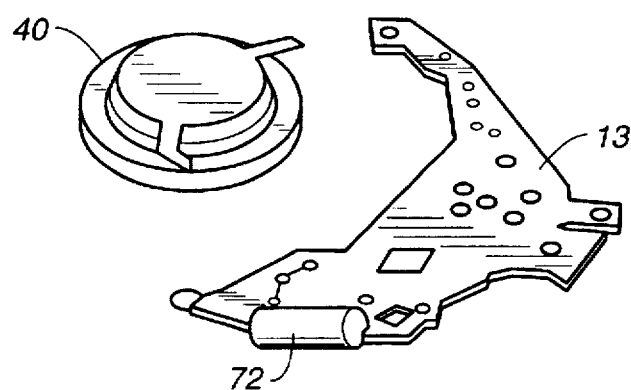
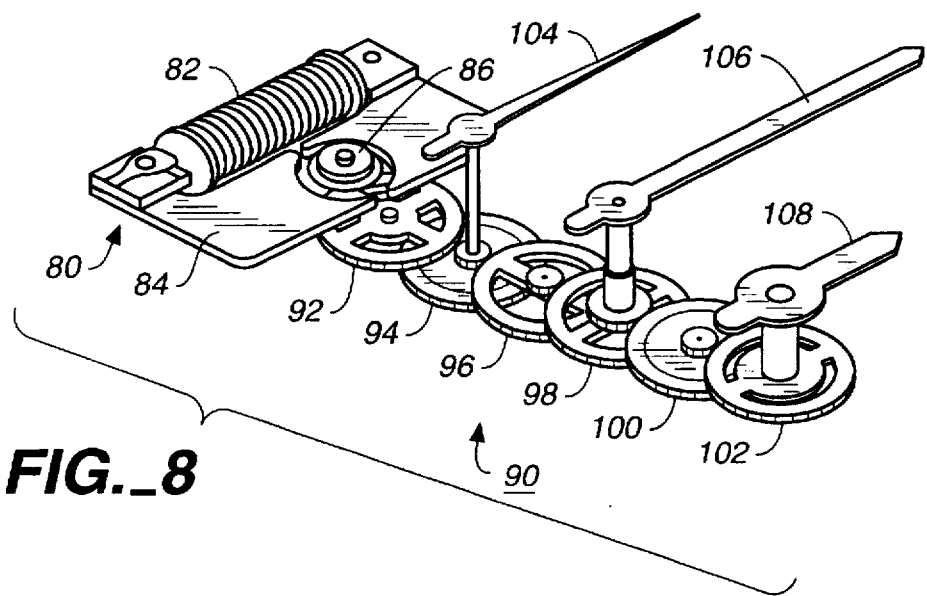
FIG._8

COATED CONDUCTOR AND PRODUCTION METHOD OF SAME AND ELECTRONIC COMPONENTS AND ELECTRONIC DEVICES THAT USE IT

BACKGROUND OF THE INVENTION

1. Field of the Invention

The invention relates to a conductor with a coating and its method of production, and more particularly to the technology used to form extremely thin insulation coating. Further, it relates to electronic components and electronic devices that can be made more compact and thinner and have improved performance by using this coated insulator.

2. Description of the Related Art

Conventionally, polyurethane, epoxy resins and other synthetic resins are widely used as insulation coating on conductors. Further, by using these types of coated conductor, various types of electronic components are produced for industry.

An example of a coil application is shown in FIG. 9 as a typical model. FIG. 9 is a cross section of a cylindrical coil as an example of the conventional component. In this drawing, copper wire 31 with a diameter of 10–50 µm is wrapped around magnetic core 33 of the coil. Copper wire 31 is covered with polyurethane insulation coating 32 about 2 µm thick. This insulation coating 32 maintains insulation between copper wires 31. Here, 36 is an insulation film about 10 to 50 µm thick for maintaining insulation between magnetic core 33 and copper wire 31. The effective wrapped surface area of this coil is indicated by 34. In order to wrap more copper wire 31 around magnetic core 33, insulation coating 32 should be thinner. This is because, the higher the ratio of the effective wind volume occupied by copper wire (conductor), or the so-called "wire ratio," the higher the electromagnetic conversion efficiency is. That is, the performance or characteristics of the coil is greatly affected by the "wire ratio."

Further, in the production of this kind of coil, the automatic wire wrapping operation for winding copper wire 31 around magnetic core 33 is normally performed at high speed. Therefore, as shown in the cross section in FIG. 9, the wire is not always wound in an orderly manner. To solve this problem in the prior art, copper wire 31 was wound around magnetic core 33 by either a winding operation performed at low speed in order to fill in all the gaps between copper wires 31 or by an automated winding operation using a special winding apparatus.

However, the insulation coating on prior art coated conductor presented the following problems.

First, industrial materials represented by polyurethanes and epoxy resins have a micronet structure, and it was necessary to make the holes in the net smaller by re-applying a number of times. That is, unless the coating is made a certain thickness, the holes in the net will not become small and the required insulation and durability characteristics (water resistance, alkaline resistance, acid resistance, etc.) cannot be satisfied. However, as the coating thickness becomes thick, the "wire ratio" in the coil decreases and sufficient electromagnetic conversion efficiency cannot be obtained.

This kind of phenomenon (not being to able to achieve a sufficient characteristic due to a thick insulation coating) is not limited to coils and applies to various types of electronic components. For example, in a multilayer substrate on which a plurality of conductor patterns are laminated, this phenomenon will cause the substrate to be thicker and hinder efforts to make components thinner.

Further, in the conventional method of insulation coating formation, application and baking must be repeated 10 to 20 times, which requires extensive production equipment and much time and makes it difficult to reduce costs.

In coil-type electronic components, when winding is performed in an orderly manner such that there is no gap between the windings of copper wire 31, much time is required in production in order to wind while controlling the gap, thus making it difficult to improve productivity.

SUMMARY OF THE INVENTION

The invention is intended to solve the above problems. The objects of the invention include:

(1) Obtain a thin insulation film with good insulation performance and good durability (water resistance, alkaline resistance, acid resistance, etc.).

(2) Obtain a coated conductor with a simple production method that can reduce cost.

(3) Obtain compact, thin, high performance electronic components using this coated conductor and obtain superior electronic devices using these electronic components.

The coated conductor of this invention features an insulation coating formed in a thin film on the conductor surface using Japanese lacquer.

It is desirable that the conductor be a thin wire with a diameter of 5 to 50 µm. It is also desirable that the electronic component be configured such that the coated conductor is disposed in layers so that the windings lay on top of one another. Therefore, the electronic component must be a coil for this to be applicable.

Also, it is desirable that the conductor be a conductor pattern formed on a substrate. It is also desirable that the electronic component be configured such that the conductors be laid on top of each other with an insulation layer formed between them. Therefore, the electronic component must a multilayer substrate for this to be applicable.

Further, it is desirable that these electronic components (coils or multilayer substrates) be used to configure electronic devices.

The production method of the coated conductor of the invention is featured by the formation of a thin-film insulation coating by applying laccase to the surface of the conductor and then applying Japanese lacquer over the laccase.

The action of the coated conductor and its production method of the invention and of the electronic components and electronic devices that use it is described below.

According to the invention, by using Japanese lacquer as the insulation coating for conductors, an extremely thin insulation coating as compared to the conventional coating can be obtained. As is known, Japanese lacquer is a mixture of four components: water, urushiol $C_{21}H_{32}O_2$, which is a type of dihydric phenol, a nitrogen-containing compound and gum. Of these, the main ingredient that forms the Japanese lacquer is urushiol, and its content determines the durability of the Japanese lacquer coating. The inventor observed the durability of this Japanese lacquer and attempted to apply it to the insulation coating of conductors. As a result, through various experiments and research on the insulation performance of Japanese lacquer, which had not been sufficiently defined, he was able to achieve an insulation performance and durability (water resistance, alkaline resistance, acid resistance) with an extremely thin coating that could not be obtained with conventional industrial polymer materials as represented by polyurethane and epoxy resin. By this means, this invention was achieved.

Accordng to the invention, by applying an extremely thin insulation coating formed by Japanese lacquer to ultrathin conductor wire or a conductor pattern, the effectiveness due to the thin thickness of the insulation coating is improved. This is because the percentage of the diameter or thickness of the ultrathin wire or conductor pattern itself occupied by the insulation coating is not small and is a value that cannot be ignored in its influence on their characteristics. That is, the thickness of the insulation coating has a marked influence on the thickness of ultrathin wire and conductor patterns.

This influence is marked in a case in which coated conductor is disposed in layers and in a case in which coated conductors are laid on top of each other to form an insulation layer. Also, the more layers there are, the greater the influence of the thickness of the insulation coating. Therefore, by using an extremely thin insulation coating as in this invention, thinner (or more compact) electronic devices can be configured.

According to the invention, by applying coated conductor to coils, it is possible to realize more compact coils than in the conventional art. Or if the same shape is used, then the number of windings can be increased, thus making it possible to realize higher-performance coils.

According to the invention, by applying coated conductor to the multilayer substrate, it is possible to realize a thinner multilayer substrate than in the conventional art. Or if the same thickness as in the conventional art is used, it is possible to increase the number of layers, thus making it possible to realize higher-performance multilayer substrates.

According to the invention, an electronic device constructed using the coil configured as described above or the multilayer substrate described above can either be made more compact and thinner by using these improved electronic components or their performance can be enhanced. These are particularly suited to small electronic devices in which portability is emphasized.

According to the invention, by applying laccase to the conductor before applying the Japanese lacquer insulation coating, differences in how the Japanese lacquer dries can be generated. By ingeniously utilizing these differences, it is possible to join the coated conductors.

When something dries, generally the moisture in the material evaporates. However, when Japanese lacquer dries, the laccase in the gum contained in the Japanese lacquer takes oxygen from the air and subjects the main ingredient urushiol to oxidative polymerization, which changes it from a liquid to a solid. In this respect, the drying of Japanese lacquer is different from drying of other materials.

That is, the speed with which Japanese lacquer dries is determined by the efficiency with which the activity of laccase is utilized. In order to quickly dry Japanese lacquer, the laccase is made active by subjecting it to a temperature greater than 20 degrees Celsius and a humidity between 75% and 85%, thereby promoting the oxidative polymerization. If the temperature is less than 4 degrees Celsius, it hardly dries at all. In other words, by effectively utilizing this laccase and by controlling the temperature, the Japanese lacquer can be dried in areas or the drying speed can be controlled.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross section of a coil showing the first embodiment of the invention.

FIG. 2 is a graph showing the insulation characteristics of the insulation coating of the invention and of a polyurethane insulation coating of the conventional art.

FIG. 3 is a cross section of a coil showing a modification of the first embodiment of the invention.

FIG. 4 is a coated conductor cross section for explaining the insulation coating of the second embodiment of the invention.

FIG. 5 is a cross section of a coil showing the second embodiment of the invention.

FIG. 6 is a cross section of a substrate showing the third embodiment of the invention.

FIG. 7 is a cross section of a multilayer substrate showing a modification of the third embodiment of the invention.

FIG. 8 is a diagram for explaining the principal components of an electronic watch in the fourth embodiment of the invention.

FIG. 9 is a cross section of a conventional coil.

DESCRIPTION OF THE PREFERRED EMBODIMENTS

In the drawings, like reference numerals refer to like elements.

First Embodiment

FIG. 1 is a cross section of an electronic component, a small coil, in which the coated conductor of the invention has been used. In this figure, copper wire is wound around magnetic core 3 of the cylindrically shaped coil in layers. In this embodiment, magnetic copper wire with a diameter of 20 μm is used as copper wire 1. However, the diameter of this wire is not limited to 20 μm, and it is desirable that copper wire with a diameter of 5 to 50 μm be used. If the diameter of the copper wire is less than 5 μm, then the reliability may be degraded with respect to the mechanical strength of the copper wire, which is not good. For example, the copper wire may more easily break in the coil wrapping operation. If the diameter of the copper wire is greater than 50 μm, on the other hand, even if the insulation coating is slightly thick, it will not have much influence on the performance (electromagnetic conversion efficiency) of the coil (i.e., even if the insulation coating is slightly thick, the wire ratio will not change that much), and therefore it will not be very effective. A more desirable range for the diameter of the copper wire is 10 to 40 μm.

Japanese lacquer coating 2 for insulating windings of copper wire 1 from each other is formed such that it covers copper wire 1, and the thickness of the coating is 0.5 μm. As is known, Japanese lacquer is a mixture of four components: water, urushiol $C_{21}H_{32}O_2$, which is a type of dihydric phenol, a nitrogen-containing compound and gum. Of these, the main ingredient that forms the Japanese lacquer is urushiol, and its content determines the durability of the Japanese lacquer coating. Further, thin-sheet-like insulation film 6 is wrapped around magnetic core 3. Insulation film 6 provides insulation between magnetic core 3 and copper wire 1, and its thickness is 20 μm. Also, copper wire 1 on which is formed insulation coating 2 serves as the coated conductor and is wrapped around magnetic core 3 in layers. The figure shows an example of a 3-layer winding, but normally more layers are used with 20 to 40 layers being very common.

Since core 3 is normally stamped from a plate by a press, burrs may occur and its corners may be sharp. Therefore, since insulation coating 2 may be easily damaged and a short-circuit may occur between magnetic core 3 and copper wire 1 if copper wire 1 is wrapped around magnetic core 3 as is, insulation film 6, etc., is wrapped around magnetic core 3 and copper wire 1 is wrapped on top of this. Further, insulation film 6 must normally have a thickness of 10 to 50 µm. In addition, since copper wire 1 is wrapped around magnetic core 3 in numerous layers, coil frame 5 for preventing collapse of the winding is affixed to magnetic core 3 so that the winding does not collapse. In the figure, 4 is the effective winding area of the coil. In order to wind more copper wire 1 in the effective winding area, insulation coating 2 should be thinner.

Here, it is more desirable that Japanese lacquer insulation coating 2 be formed on the surface of copper wire 1 in a range of 0.1 to 4.0 µm thick. Of course, sufficient performance as an insulation coating can be achieved outside of this range. However, it has been shown experimentally that if the coating thickness is less than about 0.1 µm, the insulation performance gradually degrades when the voltage applied to copper wire 1 is high. When the coating thickness exceeds 4.0 µm, on the other hand, the pliability of the insulation coating gradually decreases, thus making it impossible to say there would be no damage to the insulation coating during the winding operation. Therefore, in order to obtain a more reliable coated conductor, it is best to set the range of thickness of Japanese lacquer insulation coating 2 to 0.1 to 4.0 µm.

FIG. 2 shows the experimental results for the insulation performance (insulation breakdown voltage characteristic) of the insulation coating. In the figure, the curve indicated as Japanese lacquer insulation coating is a characteristic example applicable to the coated conductor of the invention. The curve indicated by polyurethane insulation coating is a characteristic example of a conventional technology tested for the sake of comparison. From these results, it can be seen that the Japanese insulation coating of the invention has a superior insulation characteristic compared to the conventional polyurethane insulation coating. This difference becomes especially marked as the insulation coating thickness becomes thinner. At an insulation coating of about 1 µm, the required function cannot be achieved in the case of conventional polyurethane insulation coating, but even at a coating thickness of 0.1 µm, the Japanese lacquer insulation coating of the invention can maintain sufficient insulation performance.

A modification of the first embodiment is shown in FIG. 3. This modification is an example of taking advantage of the durability of Japanese lacquer coating by using the Japanese lacquer insulation coating instead of insulation film wrapped around magnetic core 3.

In FIG. 3, 6 is the Japanese lacquer insulation coating whose thickness is sufficient at about 1 to 10 µm. In the conventional insulation film, a thickness of about 10 to 50 µm was required, but the surface of the Japanese lacquer coating was shown to be extremely durable in various experiments. Therefore, it was confirmed that sufficient insulation performance could be achieved even at a coating thickness of 1 to 10 µm. Therefore, the size of the coil can be made even more compact by utilizing this coating together with the coated conductor shown in the first embodiment. Or if the same size as in the conventional technology is used, the number of layers in which the coated conductor is wound can be increased, thus greatly enhancing the characteristics of the coil.

Second Embodiment

This embodiment takes advantage of the drying characteristic of Japanese lacquer. FIG. 1 shows an example wherein it was possible to eliminate the coil frame 5 for preventing collapse of the winding of copper wire 1.

In FIG. 4, 2 is the Japanese lacquer insulation coating and 7 is the Japanese lacquer coating formed around this Japanese lacquer insulation coating for fixing it in place. Though this joining layer 7 is shown separate from insulation coating 2, they are the same Japanese lacquer and are not different materials. For the sake of convenience, it is used here to explain the function (joining) separate from that of the Japanese lacquer insulation coating.

The production method for this coated conductor is as follows. First, laccase 8 is applied around copper wire 1 with no insulation coating. Laccase is an enzyme that takes oxygen from the air and subjects urushiol, the main ingredient of Japanese lacquer, to oxidative polymerization, which changes the Japanese lacquer from a liquid to a solid. Japanese lacquer is then applied around this laccase 8. When this is done, Japanese lacquer in contact with laccase 8 dries quickly and hardens early to form insulation coating 2. The Japanese lacquer on the outside of insulation coating 2, however, is not readily affected by laccase 8. This layer of Japanese lacquer is gradually dried by maintaining the environment at a temperature at which the Japanese lacquer does not easily dry. Therefore, its drying is delayed and it becomes joining layer 7.

By winding on magnetic core 3 in this condition, joining layers 7 readily join, and therefore the winding does not collapse even without a coil frame, thus making it possible to eliminate coil frame 5. After completion of winding, the laccase contained in the Japanese lacquer itself causes the Japanese lacquer to harden, and therefore joining layer 7 also becomes a durable insulation coating. FIG. 5 shows a cross section in which joining layers 7 have joined together. In FIG. 5, coil frame 5 is shown in order to clearly identify the position of copper wires 1 in the coil, but it becomes unnecessary after coated conductors 7 are joined by joining layer 7.

Third Embodiment

This embodiment takes advantage of the durability of the Japanese lacquer insulation coating. An example is used in which it is applied to the insulation of the conductor pattern on a substrate, which is a type of electronic component. In FIG. 6, 9 is a dual-sided substrate having conductor patterns 10 on the top and bottom surfaces. Also, 8 is laccase formed on the substrate, 2 is the Japanese lacquer coating and 7 is the joining layer. Since the basic concept is the same as in the first embodiment, it is not necessary to separate the insulation coating into the three parts: laccase, Japanese lacquer insulation coating and joining layer 3. Further, though the insulation coating is formed on only one side of the substrate, the insulation coating can be formed on both sides of the substrate in the same way. By using this configuration, a thin-film insulation coating with a superior insulation characteristic can be obtained on the substrate.

A modification of the third embodiment is explained below using FIG. 7. This is an example wherein the delayed drying of Japanese lacquer is utilized to perform insulation joining in a multilayer substrate.

First, laccase 8 is applied to one side of substrate 9. Next, Japanese lacquer is applied to the surf ace of laccase 8. When this is done, drying of t he Japanese lacquer in contact with laccase 8 is promoted, thus causing it to harden quickly and form insulation coating 2. However, the Japanese lacquer on th e side of the substrate opposite insulation coating 2 is not affected by laccase 8. Therefore, its drying is delayed and i t become s joining layer 7. Two substrates 9 configured in this manner are prepared. While in this condition, the sides of substrates 9 on which joining layers 7 are formed are placed together, whereby joining layers 7 can be easily joined and a multilayer substrate formed.

A multilayer substrate configured in this manner has a total of four conductive surfaces: one on the top, two in the middle and one on the bottom. Also, since the Japanese lacquer coating forms an extremely thin insulation layer, it is possible to configure a multilayer substrate that is thin overall to fit in less space. This is shown in FIG. 7.

This embodiment used two substrates 9, but of course it is not limited to this, and the same effect can be obtained with any number of substrates. The more layers there are, the more the thinness of the Japanese lacquer coating contributes to making the multilayer substrate thin.

Fourth Embodiment

This embodiment is an example of an electronic device, particularly an electronic watch in which compactness, thinness and performance are emphasized. It is configured using the coil of the first embodiment or the multilayer substrate of the third embodiment described above.

FIG. 8 is an explanatory diagram showing the principal parts of a non-battery-powered wrist watch with a power generation function. It converts the rotational motion of rotor 12 to electrical energy by means of power generation means 11, which includes generator coil 22, stores this electrical energy in capacitor 40, and drives gear mechanism 90 for 3-hand drive of the watch, whereby second hand 104, minute hand 106 and hour hand 108 are rotated. This is an example of an application of the invention to this generator coil 22, drive coil 82, and circuit board 13 whereon the electrical energy charge control circuit and the control circuit for gear train mechanism 90 for 3-hand drive are disposed.

In the figure, power generation means 11 comprises half-circle rotor 12 attached to the base inside the watch case, which is not shown, such that it can turn freely, gear train mechanism 14 which increases the speed of rotation by rotor 12 and generator mechanism 16 whose generator rotor 18 is driven by gear train 14.

When the user puts on the electronic wrist watch and moves his arm, rotor 12 rotates, and the kinetic energy at that time becomes rotational motion in the direction of the arrow shown in the figure. The rotation of this rotor 12 is speeded up about 100 times and transferred to generator rotor 18 by gear train 14. The magnetic flux intersecting generator coil 22 via generator stator 20 is changed by the high-speed rotation of generator rotor 18 configured from an N pole and S pole permanent magnet.

When the magnetic flux changes, electromagnetic induction causes an alternating voltage to be output from generator coil 22, and this alternating voltage is rectified by a rectifier diode not shown in the figure and charges capacitor 40 used as a secondary battery. This smoothed electrical energy is supplied and used to drive the watch circuit which uses quartz crystal 72.

This watch circuit is configured as circuit board 13 with a four-layer structure. This watch circuit comprises an oscillation circuit that uses quartz crystal 72 in its vibration member, a frequency divider circuit that divides the oscillation output, and a drive circuit that outputs driving pulses whose polarities differ every 1 ms based on the frequency divider output. The driving pulse is output to drive coil 82 of stepper motor 80 for hand rotation shown in FIG. 8. By this means, stepper motor 80, which functions as a motor for hand rotation, receives the driving pulse from drive coil 82 once every second, and rotor 86 is rotated each time.

A configuration is employed wherein the rotational output of rotor 86 is transferred to second hand 104, minute hand 106 and hour hand 108 via gear train mechanism 90 for 3-hand drive, whereby the time is displayed in analog form.

In this way, power generation means 11 is mounted in the watch case of an analog electronic watch in which a power generation function is employed. This power generation means is considerably large, and the percentage of space occupied by power generation means 11 in the wrist watch is large. Particularly in today's high density electronic watches, there is much demand for high performance in a lightweight, thin configuration, thus leaving almost no extra space. Therefore, there is no room to make the generator coil or drive coil (or circuit board) large, thus requiring that their characteristics be improved in a limited amount of space.

By using the electronic components (coil and circuit board) of the invention, characteristics (generated voltage, rotor drive energy) can be improved without making the outer shape large. Or if the characteristics can stay the same, then a smaller, lighter-weight (thinner in the case of a multilayer substrate) configuration is possible.

This embodiment relates to a wrist watch, but of course the invention is not limited to this. It is also applicable to pocket watches, pendant watches and other portable watches. Further, the electronic device of the invention is also applicable to pagers, hearing aids, calculators, cellular phones, radio transmitters, pedometers, and other applications that require compactness and portability. The electronic components of the invention are particularly suited to ultracompact electronic devices in which the space for electronic components is severely restricted.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A coated conductor, comprising:
   a copper conductor having a surface; and
   a thin film of electrically insulating Japanese lacquer formed on the surface of the copper conductor for electrically insulating the conductor, the thickness of the Japanese lacquer film being in the range of 0.1 μm to 4.0 μm.

2. The coated conductor of claim 1 wherein the Japanese lacquer is a mixture comprising water, urushiol $C_{21}H_{32}O_2$, a nitrogen-containing compound and gum.

3. The coated conductor of claim 1 wherein the conductor is an ultra-thin wire having a diameter between 5 to 50 μm.

4. The coated conductor of claim 3 wherein the Japanese lacquer is a mixture comprising water, urushiol $C_{21}H_{32}O_2$, a nitrogen-containing compound and gum.

5. An electronic component, comprising:
   a plurality of coated conductors, each of which comprises:
   an ultra thin copper wire having a surface and a diameter between 5 to 50 μm, and a thin film of electrically insulating Japanese lacquer formed on the surface of the copper wire for electrically insulating the copper wire, the thickness of the Japanese lacquer film being in the range of 0.1 µm to 4.0 µm; and wherein the plurality of conductors are disposed in layers.

6. The electronic component of claim 5 wherein the Japanese lacquer is a mixture comprising water, urushiol $C_{21}H_{32}O_2$, a nitrogen-containing compound and gum.

7. The electronic component of claim 5 wherein the electronic component is a coil.

8. The electronic component of claim 7 wherein the Japanese lacquer is a mixture comprising water, urushiol $C_{21}H_{32}O_2$, a nitrogen-containing compound and gum.

9. A coated conductor, comprising:

a copper conductor having a surface;

a layer of laccase formed on the surface of the copper conductor;

a first layer of electrically insulating Japanese lacquer formed on the layer of laccase for electrically insulating the conductor, the thickness of the Japanese lacquer layer being in the range of 0.1 µm to 4.0 µm; and a second layer of Japanese lacquer formed on the first layer of Japanese lacquer.

10. The coated conductor of claim 9 wherein the Japanese lacquer is a mixture comprising water, urushiol $C_{2l}H_{32}O_2$, a nitrogen-containing compound and gum.

11. An electronic component, comprising:

a substrate having a conductor pattern on top and bottom surfaces of the substrate;

a layer of laccase formed on one of the top and bottom surfaces of the substrate;

a first layer of electrically insulating Japanese lacquer formed on the layer of laccase for electrically insulating one of the top and bottom surfaces of the substrate, the thickness of the Japanese lacquer layer being in the range of 0.1 µm to 4.0 µm; and a second layer of Japanese lacquer formed on the first layer of Japanese lacquer.

12. The electronic component of claim 11 wherein the Japanese lacquer is a mixture comprising water, urushiol $C_{21}H_{32}O_2$, a nitrogen-containing compound and gum.

13. An electronic component, comprising:

two members, each of which comprises:

a substrate having a conductor pattern on top and bottom surfaces of the substrate;

a layer of laccase formed on one of the top and bottom surfaces of the substrate;

a first layer of electrically insulating Japanese lacquer formed on the layer of laccase for electrically insulating one of the top and bottom surfaces of the substrate, the thickness of the Japanese lacquer layer being in the range of 0.1 µm to 4.0 µm; and a second layer of Japanese lacquer formed on the first layer of Japanese lacquer as a joining layer;

wherein the two members are attached to each other at said second layers of Japanese lacquer to form a multilayer electronic component.

14. The electronic component of claim 13 wherein the Japanese lacquer is a mixture comprising water, urushiol $C_{21}H_{32}O_2$, a nitrogen-containing compound and gum.

15. An electronic device, comprising:

an electronic watch;

power generation means for supplying power to the electronic watch, the power generation means including a generator coil, the generator coil comprising:

a plurality of coated conductors, each of which comprises:

an ultra thin copper wire having a surface and a diameter between 5 to 50µm, and a thin film of electrically insulating Japanese lacquer formed on the surface of the wire for electrically insulating the wire, the thickness of the Japanese lacquer film being in the range of 0.1 µm to 4.0 µm; and wherein the plurality of conductors are disposed in layers.

16. The electronic device of claim 15 wherein the Japanese lacquer is a mixture comprising water, urushiol $C_{21}H_{32}O_2$, a nitrogen-containing compound and gum.

17. A production method for a coated copper conductor, comprising:

applying a layer of laccase on a surface of said conductor to form a first electrical insulation coating;

applying a first layer of Japanese lacquer on the layer of laccase to form a second electrical insulation coating, the thickness of the Japanese lacquer layer being in the range of 0.1 µm to 4.0 µm; and applying a second layer of Japanese lacquer on the first layer of Japanese lacquer to form a third electrical insulation coating.

18. The production method of claim 17 wherein the Japanese lacquer is a mixture comprising water, urushiol $C_{21}H_{32}O_2$, a nitrogen-containing compound and gum.

* * * * *

UNITED STATES PATENT AND TRADEMARK OFFICE
CERTIFICATE OF CORRECTION

PATENT NO.    : 5,767,450
DATED         : June 16, 1998
INVENTOR(S)   : Katsutoshi Furuhata It is certified that an error appears in the above identified patent and that said Letters Patent is hereby corrected as shown below:

Column 9, line 27, change "$C_{2l}H_{32}O_2$" to -- $C_{21}H_{32}O_2$ --.

Signed and Sealed this

Twenty-second Day of September, 1998

Attest:

BRUCE LEHMAN

*Attesting Officer*     *Commissioner of Patents and Trademarks*